(12) United States Patent
Wada et al.

(10) Patent No.: US 8,379,472 B2
(45) Date of Patent: Feb. 19, 2013

(54) SEMICONDUCTOR DEVICE AND CONTROL METHOD OF THE SAME

(75) Inventors: Hiroaki Wada, Tokyo (JP); Kazuhiro Kurihara, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/155,278

(22) Filed: Jun. 7, 2011

(65) Prior Publication Data

US 2011/0234856 A1    Sep. 29, 2011

Related U.S. Application Data

(62) Division of application No. 12/574,413, filed on Oct. 6, 2009, now Pat. No. 7,957,205, which is a division of application No. 11/501,449, filed on Aug. 8, 2006, now Pat. No. 7,606,085.

(30) Foreign Application Priority Data

Aug. 8, 2005  (WO) .................. PCT/JP2005/014496

(51) Int. Cl.
*G11C 5/14* (2006.01)
(52) U.S. Cl. ............... 365/226; 365/189.09; 365/185.08
(58) Field of Classification Search .................. 365/226, 365/189.09, 185.08
See application file for complete search history.

(56) References Cited

U.S. PATENT DOCUMENTS

| | | | |
|---|---|---|---|
| 5,872,737 A | 2/1999 | Tsuruda et al. | |
| 5,955,873 A | 9/1999 | Maccarrone et al. | |
| 6,392,469 B1 | 5/2002 | Padoan et al. | |
| 6,498,469 B2 | 12/2002 | Kobayashi et al. | |
| 6,590,444 B2 | 7/2003 | Ikehashi et al. | |
| 6,876,180 B2 * | 4/2005 | Suzuki et al. ................ | 323/270 |
| 6,992,405 B2 | 1/2006 | Zhang et al. | |
| 7,482,857 B2 | 1/2009 | Song | |
| 7,863,967 B2 * | 1/2011 | Crippa et al. ................ | 327/541 |
| 2001/0048296 A1 | 12/2001 | Halberstadt et al. | |
| 2004/0251956 A1 * | 12/2004 | Pan .............................. | 327/536 |
| 2005/0140428 A1 | 6/2005 | Tran et al. | |
| 2005/0174841 A1 | 8/2005 | Ho | |
| 2006/0113978 A1 | 6/2006 | Suzuki | |
| 2006/0158925 A1 * | 7/2006 | Cuppens ....................... | 365/154 |

FOREIGN PATENT DOCUMENTS

JP          4306714 A       10/1992

* cited by examiner

*Primary Examiner* — Vu Le
*Assistant Examiner* — Han Yang

(57) ABSTRACT

The present invention is a semiconductor device including: a resistor R11 (first resistor part) and an FET 15 (second resistor part) connected in series between a power supply Vcc (first power supply) and ground (second power supply); an output node N11 provided between the resistor R11 and FET 15 and used for outputting a reference voltage; a feedback node N12 provided between the power supply Vcc and the ground; and a voltage control circuit (19) that maintains a voltage of the feedback node N12 at a constant level by using the reference voltage of the output node N11 and the voltage of the feedback node N12. The present invention can provide a semiconductor device having a reference voltage generating circuit capable of generating the reference voltage that does not greatly depend on a power supply voltage and its control method.

4 Claims, 13 Drawing Sheets

——— EMBODIMENT
-------- CONVENTIONAL

SEMICONDUCTOR DEVICE AND CONTROL METHOD OF THE SAME

CROSS-REFERENCES TO RELATED APPLICATIONS

This application is a divisional of U.S. patent application Ser. No. 12/574,413, filed on Oct. 6, 2009, entitled "Semiconductor Device and Control Method of the same," which is a divisional of U.S. patent application Ser. No. 11/501,449, filed on Aug. 8, 2006, entitled "Semiconductor Device and Control Method of the same," which is a continuation in part of International Application number PCT/JP2005/014496 filed on Aug. 8, 2005, which are hereby incorporated herein by reference in their entirety.

TECHNICAL FIELD

This invention generally relates to a semiconductor device and control method of the same, and more particularly, to a semiconductor device having a reference voltage generating circuit and its control method.

BACKGROUND OF THE INVENTION

A semiconductor device is equipped with a reference voltage generating circuit that generates a reference voltage for reference. For example, in semiconductor memory devices, a reference voltage is used to write data into memory cells and is used to generate a voltage used for reading. It is thus required that the reference voltage generating circuit is capable of quickly generating the reference voltage substantially immune to temperature changes and variations in the power supply voltage.

FIG. 1 (Prior Art) is a diagram of a circuit configuration of a reference voltage generating circuit 70 according to a first conventional art. Referring to this figure, a P-FET 71, a resistor R71 and an N-FET 72 are connected in series between a power supply Vcc and ground. The FET 71 functions as a switch for activating the reference voltage generating circuit 70 in response to ENFVREFB. The gate and drain of FET 72 are short-circuited. An output node N71 is provided between the resistor R71 and FET 72, and a reference voltage FBREF is available via the output node N71. In the first conventional art, the power supply Vcc is divided by the resistor R71 and FET 72 to thus generate the reference voltage FVREF.

FIG. 2 (Prior Art) is a diagram of a circuit configuration of a reference voltage generating circuit 80 (second conventional art) disclosed in Document 1 (Japanese Utility Model Application Publication No. 56-4266). The reference voltage VREF is output via an output node N81 provided between an N-FET 85 and an N-FET 86 connected between a power supply VD and ground. The FET 86 has gate and drain that are short-circuited, and functions as a diode. Resistors R81 and R82 are disposed between the power supply VD and the ground, and a voltage VR obtained by dividing the power supply voltage VD by the resistors R81 and R82 is available via the node N82. VREF and VR are applied to a differential amplifier 84. The differential amplifier 84 has P-FETs 81 and 82, and N-FETs 83, 84 and 88. The FET 88 is a current source for the differential amplifier 84, and the gate of the FET 88 is connected to the power supply VD. The output of the differential amplifier 84 is connected to the gate of FET 85.

In the reference voltage generating circuit 80 of the second conventional art, the resistors R81 and R82 are designed to have given values that define a desired value of VR. When VREF is higher than VR, a decreased current flows through FET 85 and the VREF is reduced. In contrast, when VREF is lower than VR, an increased current flows through FET 85 and the VREF is increased. In this manner, the reference voltage VREF is maintained at the constant level.

The reference voltage generating circuit 70 of the first conventional art is capable of generating the stabilized reference voltage shortly after the operation signal FNFVREFB is applied. Further, the reference voltage is stable to temperature changes. However, when the power supply Vcc varies, the reference voltage VFREF changes greatly. It is difficult to generate the reference voltage stable to variations in the power supply voltage in the reference voltage generating circuit capable of quickly generating the reference voltage stable to temperature changes.

The reference voltage generating circuit 80 of the second conventional art has an arrangement such that the power supply VD is applied to the gate of the current source FET 88 of the differential amplifier 84. However, the differential amplifier 84 is also supplied with the voltage VR generated by dividing the power supply voltage VD by the resistors. Thus, only limited feedback control to variations in the power supply voltage VD is available.

SUMMARY OF THE INVENTION

The present invention has been made taking into consideration the above circumstances and has an object to provide a semiconductor device equipped with a reference voltage generating circuit capable of generating a reference voltage that less depends on a power supply voltage.

According to an aspect of the present invention, there is provided a semiconductor device including: first and second resistor parts connected in series between a first power supply and a second power supply; an output node provided between the first and second resistor parts, a reference voltage being output via the output node; a feedback node provided between the first power supply and the first resistor part; and a voltage control circuit that maintains a voltage of the feedback node at a constant level by using the reference voltage of the output node and the voltage of the feedback node. Even if the voltage of the first power supply varies, the voltage of the feedback node can be maintained at the constant level due to the function of the voltage control circuit. Thus, the voltage of the output node can be maintained at a constant level. It is thus possible to generate the reference voltage that does not greatly depend on the power supply voltage.

The semiconductor device may be configured so that the voltage control circuit comprises a differential amplifier circuit that receives the reference voltage of the output node and the voltage of the feedback node, and a current control circuit that controls a current flowing between the first power supply and the feedback node by using an output of the differential amplifier circuit. The voltage of the feedback node can be maintained at the constant level in such a manner that the current control circuit controls the current between the first power supply and the feedback node. It is thus possible to generate the reference voltage that has much less dependence on the power supply voltage.

The semiconductor device may be configured so that the current control circuit includes an FET having a gate connected to the output of the differential amplifier circuit, and a source and a drain connected to the first power supply and the feedback node, respectively. The voltage of the feedback node can be maintained at the constant level in such a manner that the current control circuit controls the current between the first power supply and the feedback node. It is thus possible to generate the reference voltage that has much less dependence on the power supply voltage.

The semiconductor device may be configured so that the voltage of the feedback node is divided with a voltage ratio of the output node and the feedback node, and a divided voltage is applied to the differential amplifier circuit. It is thus possible to further stabilize the voltage of the feedback node and generate the reference voltage that has much less dependence of the power supply voltage.

The semiconductor device may be configured so that the second resistor part is a diode having a forward direction from the output node to the second power supply. The voltage of the output node can be clamped more easily due to the forward voltage of the diode. It is thus possible to generate the reference voltage that has much less dependence on the power supply voltage.

The semiconductor device may further include a memory cell connected to the output node. It is possible to supply the stabilized voltage to a memory cell that needs the stable reference voltage immune to temperature change and variations in power supply voltage.

The semiconductor device may further include a voltage generating circuit that generates a voltage applied to the memory cell by using the reference voltage. The voltage applied to the memory cell may be generated from the reference voltage, and is thus stable to variations in the power supply voltage Vcc.

The semiconductor device may be configured so that the reference voltage is used for reading data from the memory cell. The reference voltage may be used for reading data from a memory cell that needs the reference voltage that can be stabilized quickly.

The semiconductor device may further include a switch that is coupled with the output node and causes the reference voltage to be generated in response to a change of an address that specifies the memory cell. The reference voltage may be generated when the address for the memory cell changes.

According to another aspect of the present invention, there is provided a method of controlling a semiconductor device equipped with first and second resistor parts connected in series between a first power supply and a second power supply; an output node provided between the first and second resistor parts, a reference voltage being output via the output node; and a feedback node provided between the first power supply and the first resistor part, the method comprising the steps of: maintaining a voltage of the feedback node at a constant level by using the reference voltage of the output node and the voltage of the feedback node; and outputting the reference voltage via the output node. The voltage of the feedback node is maintained at the constant level by the voltage control circuit. Thus, even if the first power supply varies, the voltage of the output node can be maintained at a constant level. It is thus possible to generate the reference voltage that does not greatly depend on the power supply voltage.

The method may further include a step of generating a voltage applied to a memory cell by using the reference cell. The voltage applied to the memory cell may be derived from the reference voltage.

The method may further include a step of reading data from the memory cell. The reference voltage may be used for reading data from the memory cell that needs the reference voltage that can be stabilized quickly.

BRIEF DESCRIPTION OF THE DRAWINGS

FIG. 4($b$) is a graph of the output voltage FVREF of the reference voltage generating circuit of the first embodiment as a function of temperature;

FIG. 4($c$) is a graph of the output voltage FVREF of the reference voltage generating circuit of the first embodiment as a function of power supply voltage Vcc;

DESCRIPTION OF THE PREFERRED EMBODIMENTS

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

A description will now be given of embodiments with reference to the accompanying drawings.

First Embodiment

Figure 1:
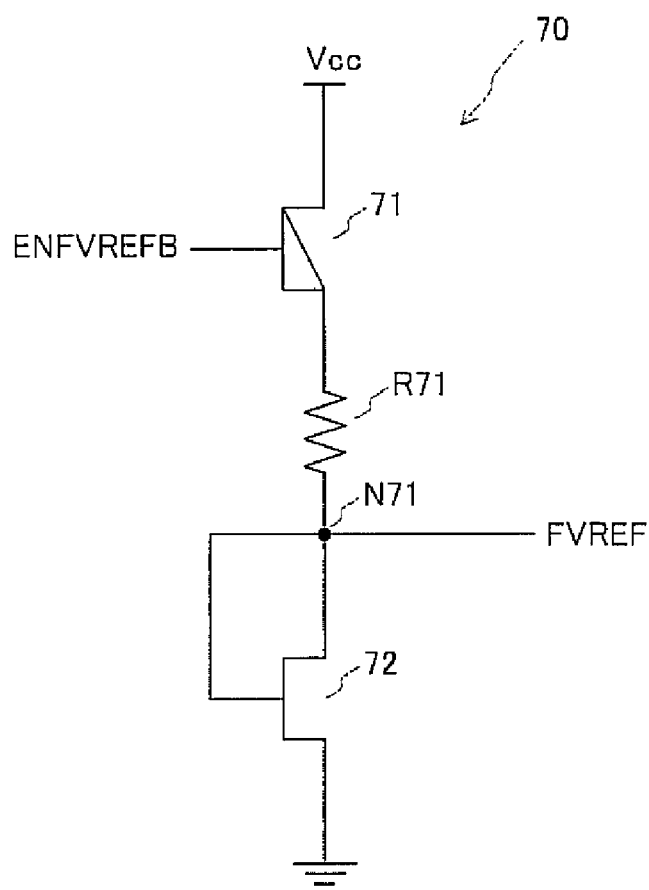
FIG. 1 (Prior Art) is a circuit diagram of a reference voltage generating circuit in accordance with a first conventional art.
Figure 2:
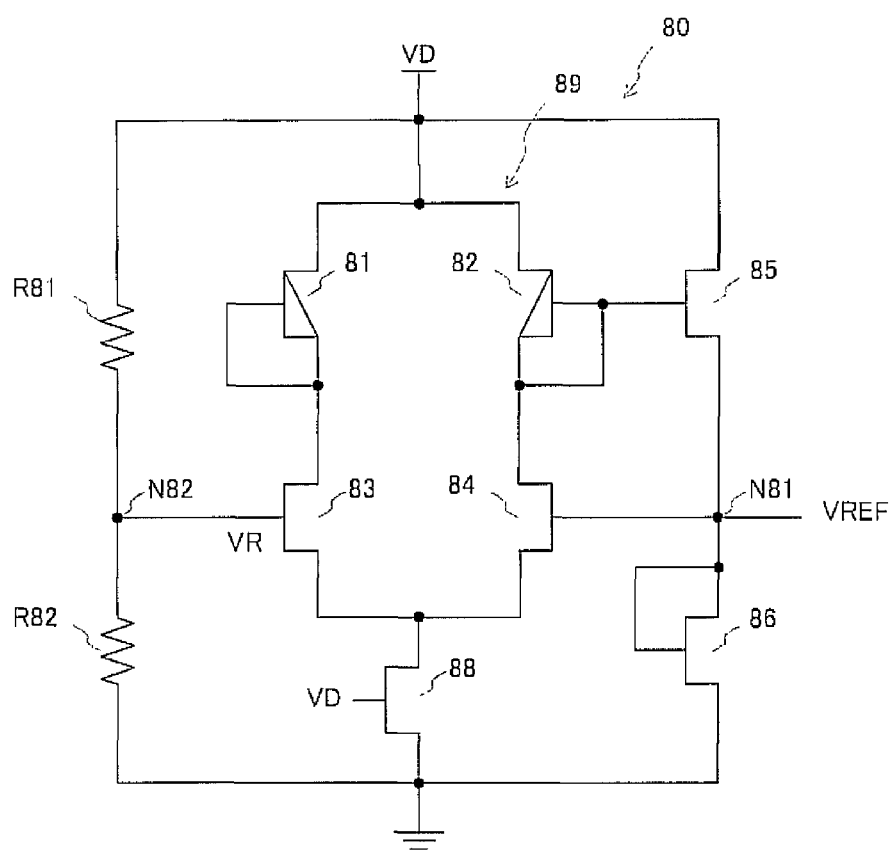
FIG. 2 (Prior Art) is a circuit diagram of a reference voltage generating circuit in accordance with a second conventional art.
Figure 3:
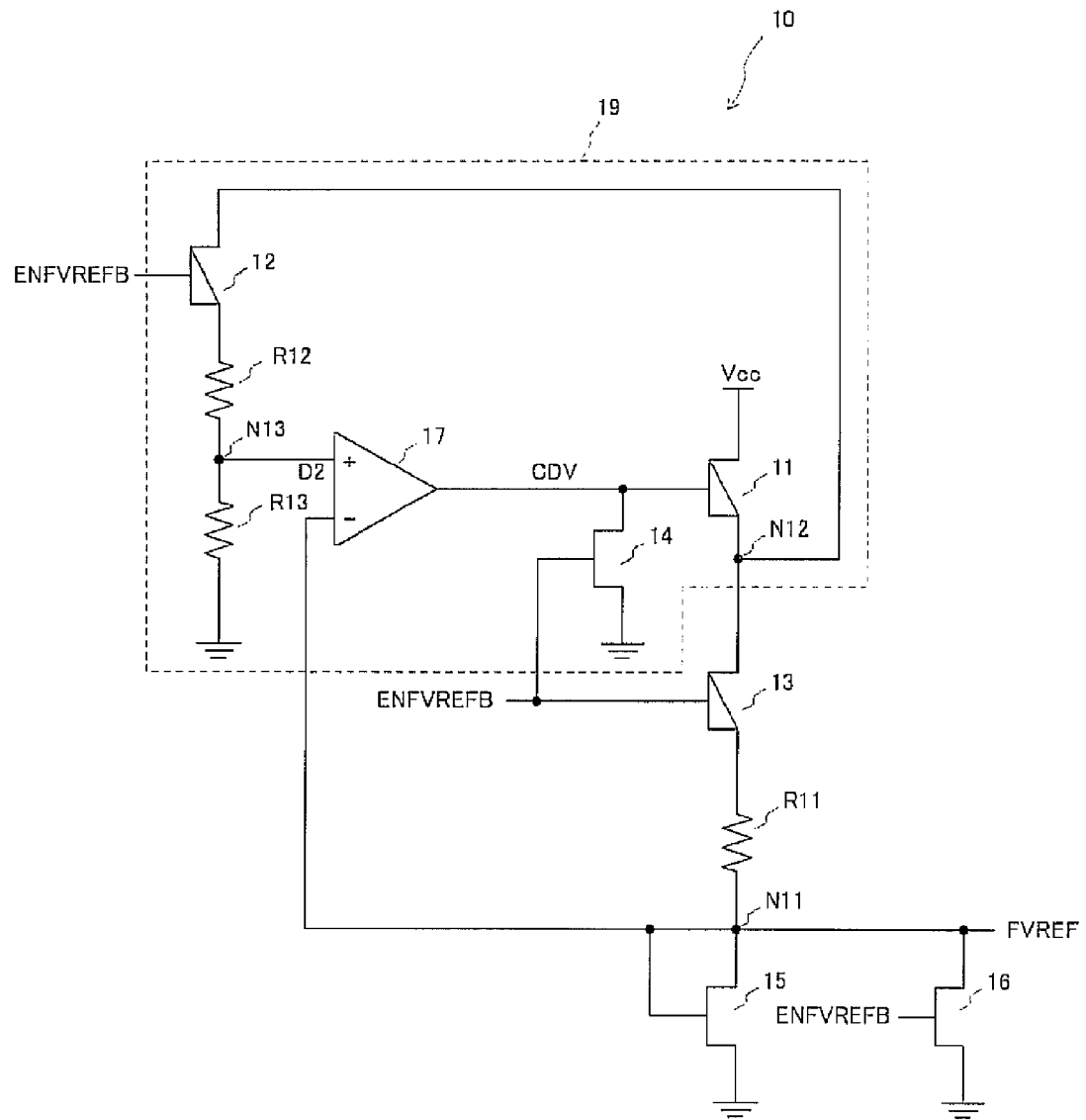
FIG. 3 is a circuit diagram of a reference voltage generating circuit in accordance with a first embodiment.

A first embodiment is an exemplary reference voltage generating circuit. FIG. 3 is a circuit diagram of the reference voltage generating circuit of the first embodiment. A resistor R11 and an N-FET 15 are connected in series between power supply Vcc and ground, and an output node N11 is provided between the resistor R11 and N-FET 15. A reference voltage FVREF is output via the output node N11. The gate and drain of FET 15 are short-circuited, and the source is grounded. The drain of FET 15 is connected to the node N11. The FET 15 functions as a diode having a forward direction from the output node N11 to ground. An N-FET 16 is connected between the output node N11 and ground. A voltage control circuit 19 and a P-FET 13 are connected in series between the power supply Vcc and the resistor R11. A feedback node N12 is provided between the voltage control circuit 19 and FET 13. That is, the feedback node N12 is provided between the power supply Vcc and the resistor R11.

The voltage control circuit 19 has a differential amplifier 17 and a P-FET 11. Resistors R12 and R13 are connected in series between the ground and the feedback node N12. A node N13 is provided between the resistors R12 and R13. A voltage 132 at the node N13 and the voltage FBREF of the output node are applied to the differential amplifier 17, and an output CDV of the differential amplifier 17 is applied to the gate of the FET 11. A P-FET 12 is connected between the feedback node N12 and the resistor R12, and an N-FET 14 is connected between the CVD and ground. The gates of FETs 12, 13, 14 and 16 are supplied with a complementary signal ENFVREFB of the enable signal ENFVREF of the reference voltage generating circuit 10. When the enable signal ENFVREF is switched to the high level, the FETs 12 and 13 are turned ON, and the FETs 14 and 16 are turned OFF. This causes the reference voltage generating circuit 10 to start to generate the reference signal. The FETs 12 through 14 function as switches for activating generation of the reference voltage.

The resistor R11 and FET 15 divide the voltage between the feedback node N12 and ground to thus generate FVREF. The power supply voltage Vcc is, for example, about 3 V, and the voltages of the feedback node N12 and output node N11 are set to 2 V and 1.1 V, respectively. When the resistors R12 and R13 have a ratio of 0.9:1.1, the resultant voltage 132 of the node N13 is approximately 1.1 V. The differential amplifier 17 is supplied with D2 and FVREF, and amplifies the difference therebetween. A resultant difference voltage is then applied to the gate of the P-FET 11.

When FVREF is lower than D2, CDV is negatively amplified and FET 11 is caused to flow an increased amount of current. This raises the potential of the feedback node N12. On the contrary, when FVREF is higher than D2, CDV is positively amplified, and FET 11 is caused to flow a decreased amount of current. This decreases the potential of the feedback node N12. In this manner, the feedback control is performed so that the voltage of the feedback node N12 is constantly maintained. Thus, even if the power supply voltage Vcc varies, the variation in the potential of the feedback node N12 can be reduced, and the variation in FVREF can be reduced. The resistor R11 may be made of polysilicon has a temperature coefficient of current approximately equal to that of FET 15. Thus, the voltage dividing ratio of the resistor R11 to FET 15 does not depend on temperature at all.

Figure 4A:
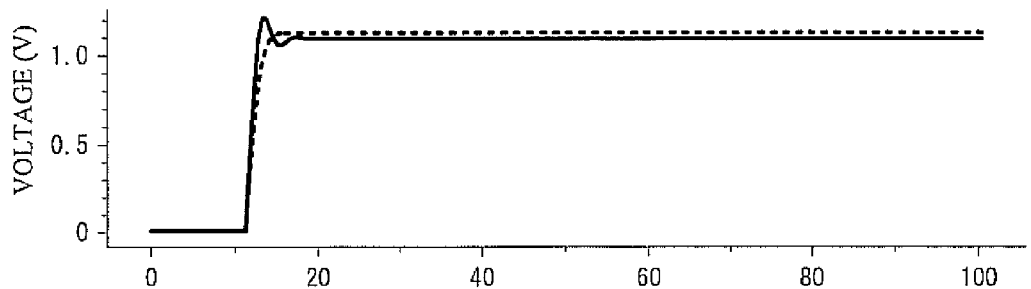
FIG. 4($a$) is a graph of an output voltage FVREF of the reference voltage generating circuit of the first embodiment as a function of time.
Figure 4B:
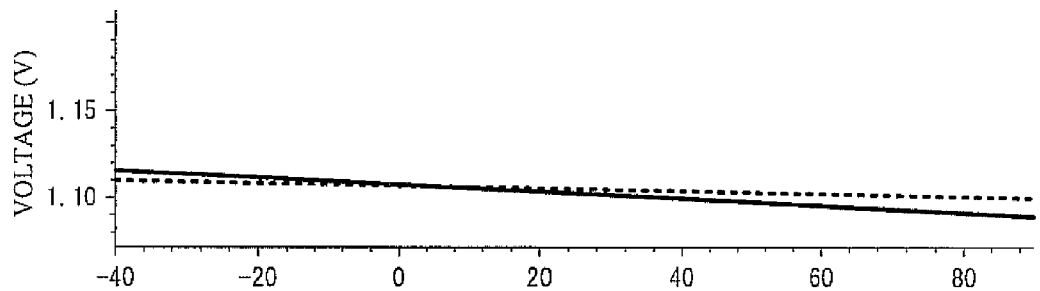
Figure 4C:
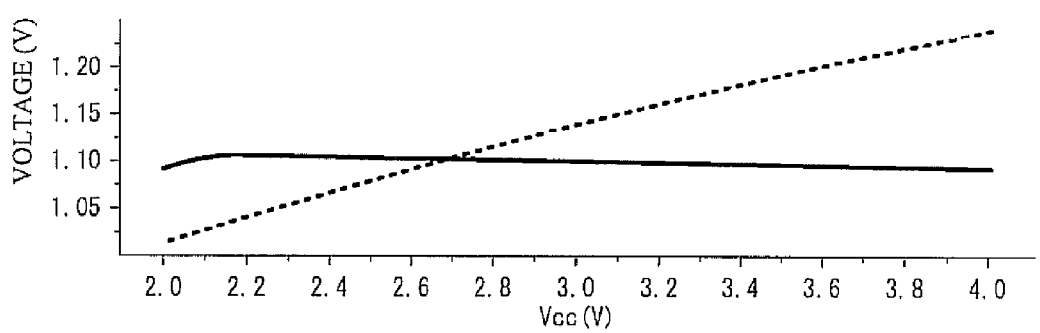

FIG. 4(a) is a diagram of the output voltages FVREF of the reference voltage generating circuit 10 in accordance with the first embodiment and the first conventional art as a function of time, FIG. 4(b) is a diagram of the output voltages as a function of temperature, and FIG. 4(c) is a diagram of the output signals as a function of power supply voltage Vcc. Referring to FIG. 4(a), the time necessary for the reference voltage FVREF to be stabilized in accordance with the first embodiment is nearly equal to that in accordance with the first conventional art. Referring to FIG. 4(b), a variation in the reference voltage FVREF observed when the temperature of the circuit of the first embodiment is changed from −40° C. to 90° C. is almost the same as that for the first conventional art. Referring to FIG. 4(c), the reference voltage FBREF in the circuit of the first conventional art changes greatly from about 1 V to 1.2 V when the power supply voltage Vcc is changed from 2 V to 4 V. In contrast, the reference voltage FVREF can be stabilized about 1.1 V in the circuit of the first embodiment. Thus, the first embodiment can quickly generate the reference current stable to variations in temperature and power supply voltage.

The reference voltage generating circuit 10 of the first embodiment has the resistor R11 (first resistor part) and FET 15 (second resistor part) connected in series between the power supply Vcc (first power supply) and the ground (second power supply). The output node N11 for outputting the reference voltage is provided between R11 (first resistor part) and FET 15 (second resistor part). Further, the reference voltage generating circuit 10 has the voltage control circuit 19 that uses the voltage FVREF of the output node N11 and the voltage of the feedback node N12 in order to maintain the voltage of the feedback node N12 at the given constant level. Thus, even when the power supply voltage Vcc changes, the voltage of the feedback node N12 is maintained at the given constant level, and the voltage of the output node N11 is maintained at the constant level. The reference voltage that does not depend on the power supply voltage greatly can be generated.

The voltage control circuit 19 has the difference amplifier circuit 17 supplied with the voltage FVREF of the output node N11 and the voltage of the feedback node N12, and FET 11 (current control circuit) that controls the current between the power supply Vcc (first power supply). The gate of FET 11 (current control circuit) is connected to the output of the differential amplifier circuit 17, and the source and drain thereof are connected to the power supply Vcc (first power supply) and the feedback node N12. The FET 11 controls the current that flows between the power supply Vcc (first power supply) and the feedback node N12, so that the voltage of the feedback node N12 can be further maintained at the constant level. Thus, the voltage of the output node N11 can be further maintained at the constant level. It is thus possible to generate the reference voltage in which the degree of dependence on the power supply voltage is further reduced.

The voltage of the feedback node N12 is divided by the voltage dividing ratio of the output node N11 to the feedback node N12 (for example, 1.1 V and 2.0 V), and is then applied to the differential amplifier circuit 17. The divided voltage D2 is compared with the voltage FVREF of the output node N11, and the voltage of the feedback node N12 is controlled based on the comparison result. Thus, the voltage of the feedback node N12 can be stabilized more reliably. It is thus possible to generate the reference voltage in which the degree of dependence on the power supply voltage is further reduced.

The FET 15 (second resistor part) is the diode having the forward direction from the output node N11 to the ground (second power supply). Clamping of the voltage of the output node is facilitated due to the forward voltage of the diode, so that the voltage of the output node N11 can be further maintained.

The first embodiment employs the positive power supply voltage and ground for the power supply. However, the present invention is not limited to the above power supply but may use arbitrary voltages. It is thus possible to produce a desired voltage between the two power supply voltages by selecting the diode characteristic of FET 15.

Second Embodiment

Figure 5:
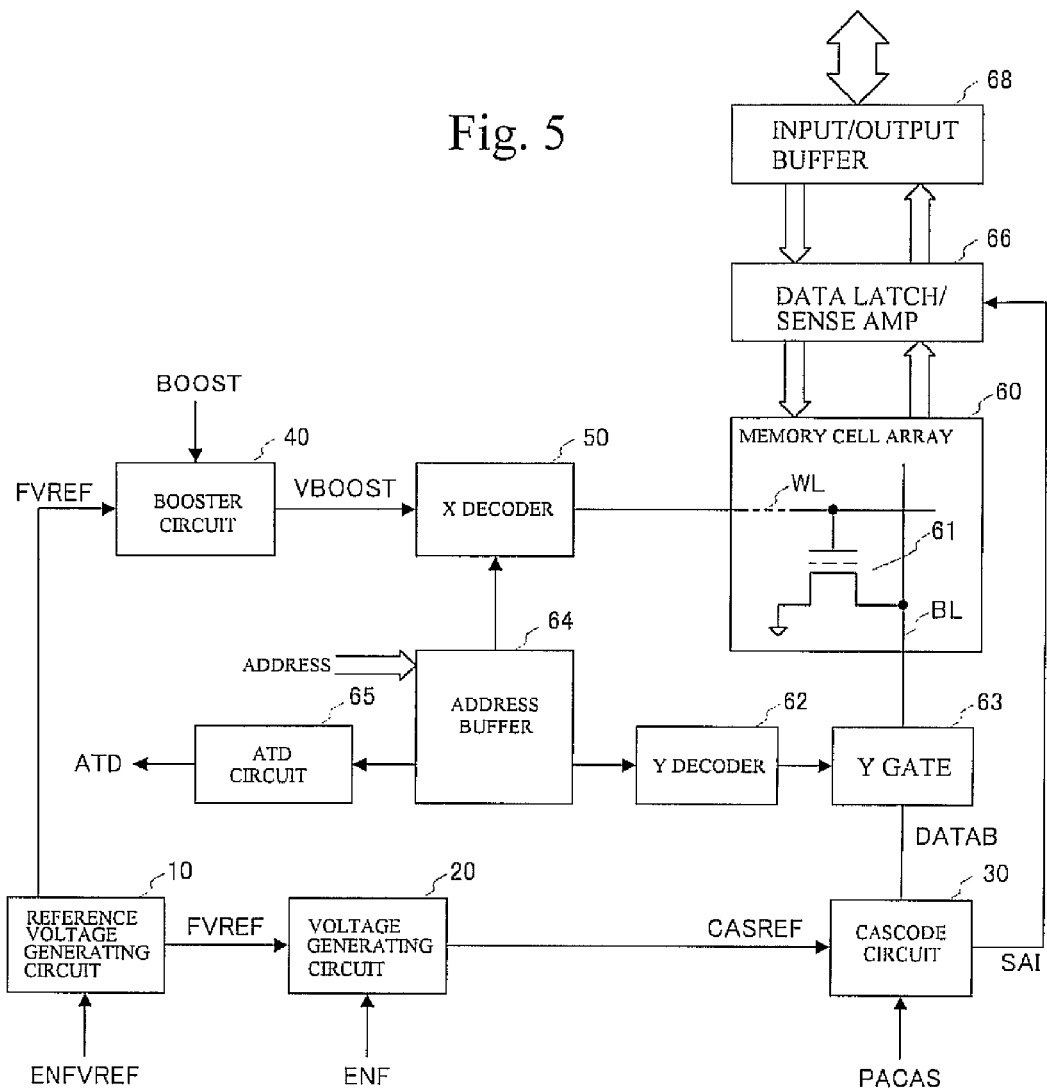
FIG. 5 is a block diagram of a reference voltage generating circuit and a periphery of a memory cell array in a flash memory in accordance with a second embodiment.

A second embodiment is an example of a NOR flash memory to which the reference voltage generating circuit 10 of the first embodiment is applied. FIG. 5 is a block diagram of the above flash memory. A memory cell array 60 has memory cells 61 arranged in rows and columns. The gate of a transistor that forms a memory cell 61 is connected to a word line WL, and the drain thereof is connected to a bit line BL. The source of the transistor is connected to a source line. The bit line BL is connected to a Y gate 63, which selects the bit line BL in response to a select signal from a Y decoder 62. The word line WL is connected to an X decoder 50 that selects the word line WL. The X decoder 50 and the Y decoder 62 select the word line WL or bit line BL in response to an instruction by an address buffer 64. An ATD circuit 65, which generates an address transition detection (ATD) signal, is connected to the address buffer 64.

The bit line BL is connected to DATAB of a cascode circuit 30 via the Y gate 63. The cascode circuit 30 precharges the bit line BL through DATAB at the time of reading data from the memory cell 61. Further, the cascode circuit 30 converts the current flowing through the bit line BL into a voltage, and outputs a voltage SAI to a data latch/sense amplifier 66. Data may be externally output so that the data latch/sense amplifier 66 refers to the output SAL of the cascode circuit 30 and determines whether data in the memory cell is "1" or "0", and outputs the data to an input/output buffer 68, which outputs the data to an outside of the flash memory. Data externally applied to the input/output buffer 68 is applied to the data latch/sense amplifier 66, and is written into the memory cell 61 selected by the X decoder 50 and the Y decoder 62.

The output voltage FVREF of the reference voltage generating circuit 10 is applied to a voltage generating circuit 20 and a booster circuit 40. An output CASREF of the voltage generating circuit 20 is input to the cascode circuit 30, and an output VBOOST of the booster circuit 40 is input to the X decoder 50.

Figure 6:
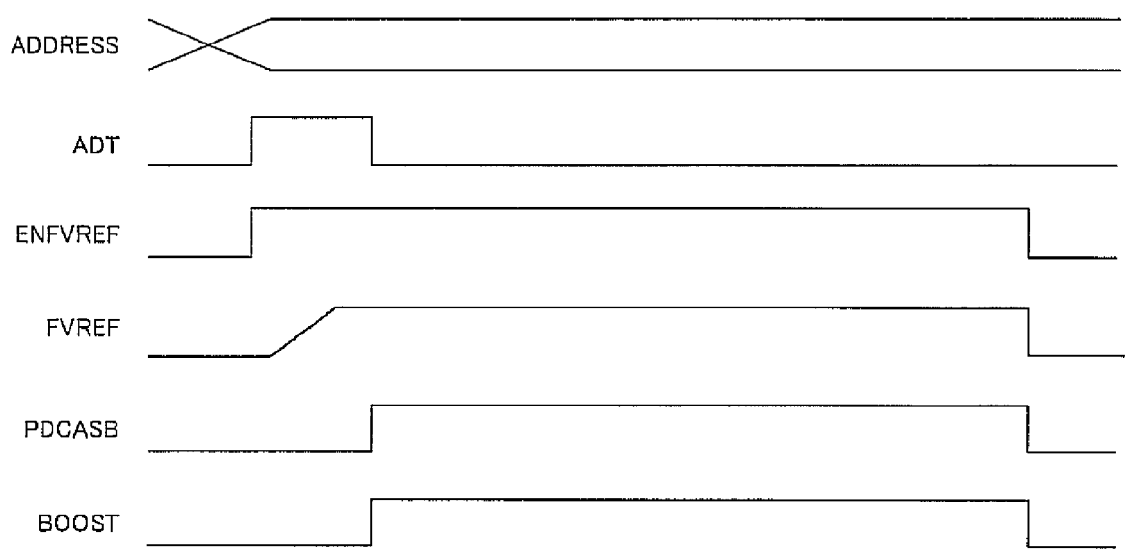
FIG. 6 is a timing chart of an operation in which data is read from a memory cell of the flash memory in accordance with the second embodiment.

Referring to FIGS. 5 and 6, a description will be given of an operation in which data is read from the memory cell 61. FIG. 6 is a timing charge of an operation in which data is read from the memory cell 61. An address that specifies a memory cell (an address signal ADDRESS in FIG. 6) changes. The ATD circuit 65 detects the above address change and changes the ATD signal to the high level. The enable signal ENFVREF of the reference voltage generating circuit 10 is interlocked with the ATD signal, and is thus switched to the high level. Thus, the reference voltage generating circuit 10 applies, as FVREF, a voltage of, for example, 1.1 V, to the voltage generating circuit 20 and the booster circuit 40. When FVREF has been stabilized, the ATD signal is switched to the low level, which changes an enable signal PDCASB of the cascade signal 30 and an enable signal BOOST of the booster circuit 40 to the high level. The voltage generating circuit 20 refers to FVREF, and outputs a voltage of, for example, 1.4 V to the cascode circuit 30 as CASREF. The booster circuit 40 refers to FVREF and applies VBOOST of, for example, 4.5 V, to the X decoder 50.

The cascode circuit 30 precharges the bit line BL selected by the Y gate 63 to 1.4 V. The X decoder 50 sets the selected word line WL to 4.5 V. The cascade circuit 30 converts the current that flow between the source and drain of the selected memory cell 61 into the voltage SAL, which is output to the data latch/sense amplifier 66. Then, the data latch/sense amplifier 66 compares the SAI with the voltage of the reference cell, and determines whether the data in the memory cell 61 is "0" or "1". The data latch/sense amplifier 66 outputs the data to the input/output buffer 68. When reading of data from the memory cell 61 is completed, ENFVREF switches to the low level and FVREF also switches to the low level. Further, PDCASB and BOOST switch to the low level. The input/output buffer 68 outputs data to the outside of the flash memory.

Figure 7:
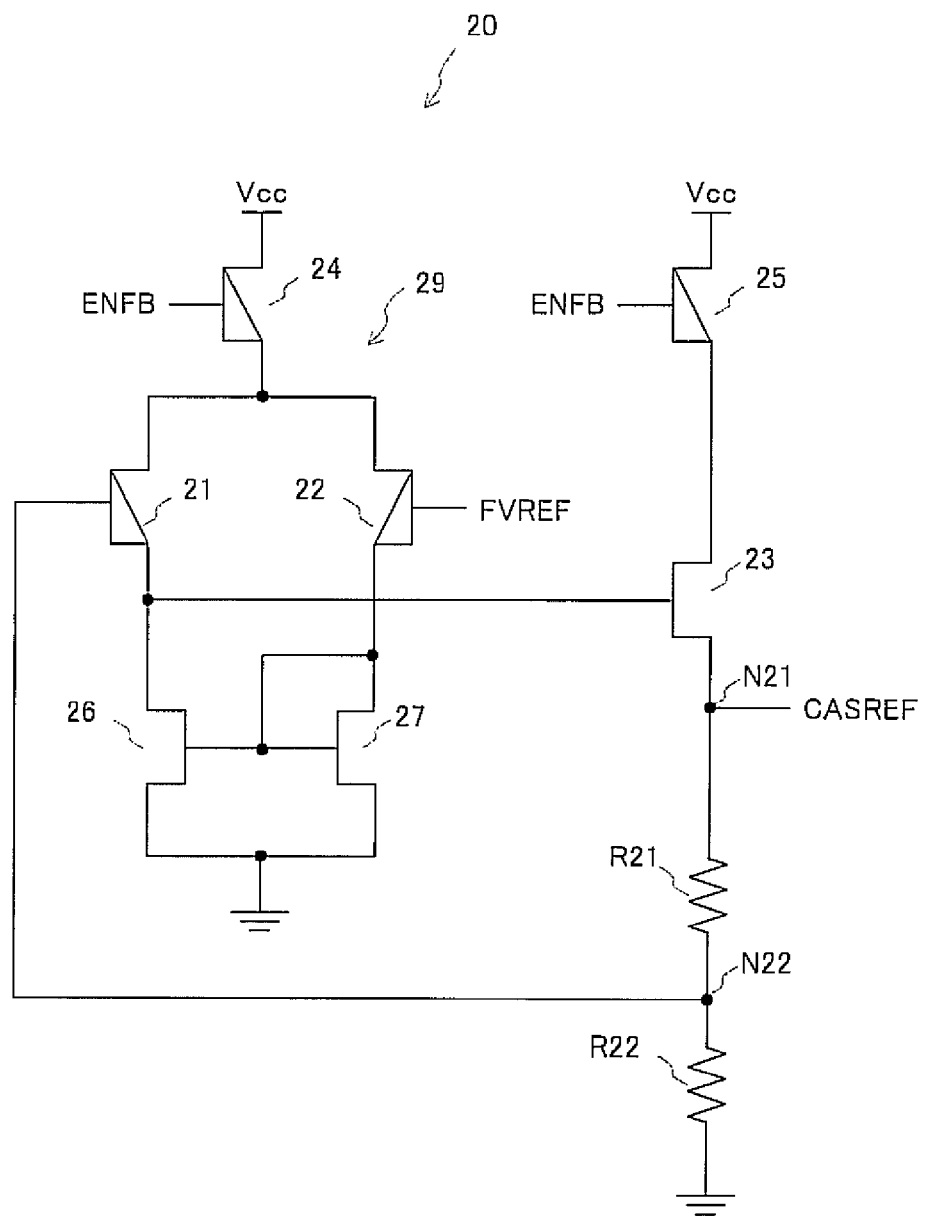
FIG. 7 is a circuit diagram of a voltage generating circuit 20 in the flash memory in accordance with the second embodiment.

A description will now be given, with reference to FIG. 7, of a circuit configuration and operation of the voltage generating circuit 20. A P-FET 25, an N-FET 23, and resistors R21 and R22 are connected in series between the power supply Vcc and ground. The FET 25 is a switch that is turned ON/OFF in response to a complementary signal ENFB of an enable signal ENF. The FET 23 is connected so that the gate is connected to the output of the differential amplifier circuit 29, and the source and drain are connected to the FET 25 and the resistor R21, respectively. The output node N21 is provided between the FET 23 and the resistor R21, and an output voltage CASREF is available via the output node N21. The node N22 is provided between the resistors R21 and R22. The differential amplifier circuit 29 includes the P-FETs 21 and 22, and N-FETs 26 and 27. The differential amplifier circuit 29 is supplied to the voltage of the node N22 and FVREF. The P-FET 24 is connected between the differential amplifier circuit 29 and the power supply Vcc. The FET 24 is a switch that is turned ON/OFF in response to the complementary signal ENFB of the enable signal ENF.

It is now assumed that the resistance ratio of the resistance R21 to R22 is 0.3:1.1. The current of the FET 23 is controlled so that the voltage of the node N22 is equal to the voltage FVREF, which may be 1.1 V. When the voltage of the node N22 becomes equal to, for example, 1.1 V, the voltage CASREF of the output node N21 is equal to 1.4 V. In this manner, the voltage generating circuit 20 refers to FVREF and generates CASREF. By changing the ratio of the resistors R21 and R22, an arbitrary voltage between the power supply voltage Vcc and ground can be generated.

Figure 8:
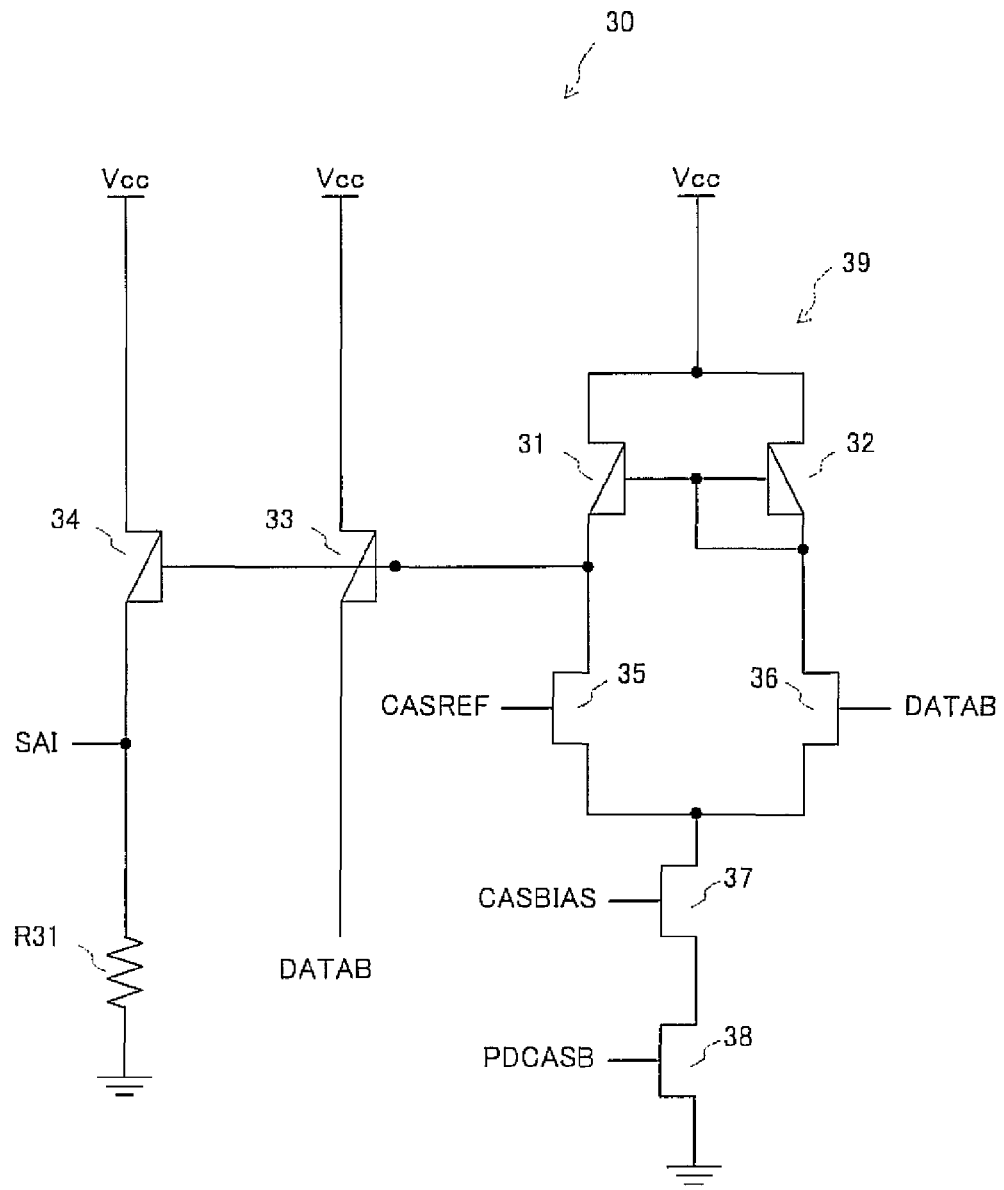
FIG. 8 is a circuit diagram of a cascode circuit 30 in the flash memory in accordance with the second embodiment.

A circuit configuration and operation of the cascade circuit 30 will now be described with reference to FIG. 8. The cascade circuit 30 includes a differential amplifier circuit 39, which includes P-FETs 31 and 32, and N-FETs 35 and 36. The FET 37 is a current source for the differential amplifier circuit 39 and is supplied with a signal CASBIAS. The differential amplifier circuit 39 is supplied with the CASREF of the voltage generating circuit 20 and DATAB connected to the bit line BL. An N-FET 38 is connected between the differential amplifier circuit 39 and the ground. The N-FET 38 functions as a switch that is turned ON/OFF in response to an enable signal PDCAS for the cascade circuit 30.

The source and drain of P-FET 33 are connected between the power supply Vcc and DATAB connected to the bit line BL. The gate of the FET 33 is connected to the output of the differential amplifier circuit 39. When PDCASB switches to the high level, the FET 33 controls the current so that the voltage of DATAB becomes equal to CASREF. Thsu, the bit line BL connected to DATAB is set to 1.4 V that is the voltage of CASREF. A P-FET 34 and a resistor R31 are connected between the power supply Vcc and the ground. The gate of the FET 34 is connected to the output of the differential amplifier circuit 39 to which the gate of the FET 33 is connected. The voltage SAI of a node N31 between the FET 33 and the resistor R31 is output to the data latch/sense amplifier 66. A current flows through the memory cell 61, and current flows through the FET 33. Since the gates of the FETs 33 and 34 are commonly connected, the same current flows through the FET 34. This current flows through the resistor R31 and is converted into the voltage SAI. In this manner, the current that flows through the memory cell 61 is converted into the voltage SAI.

Figure 9A:
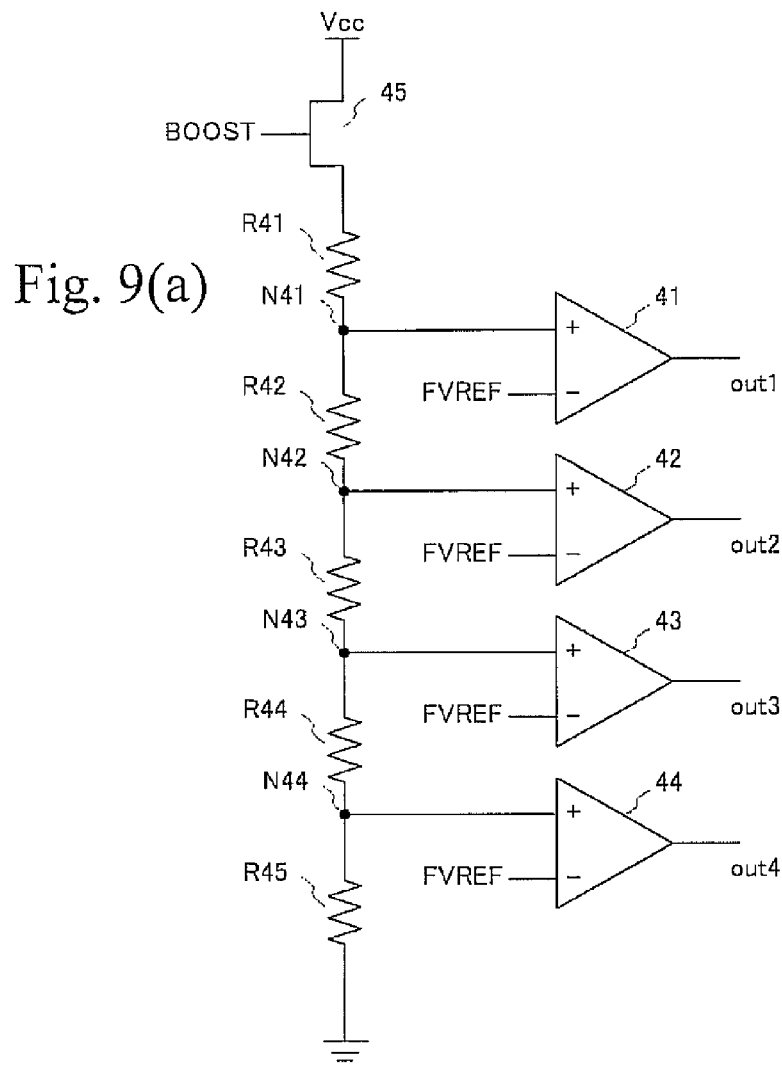
FIGS. 9($a$) and 9($b$) are circuit diagrams of a booster circuit 40 used in the flash memory in accordance with the second embodiment.
Figure 9B:
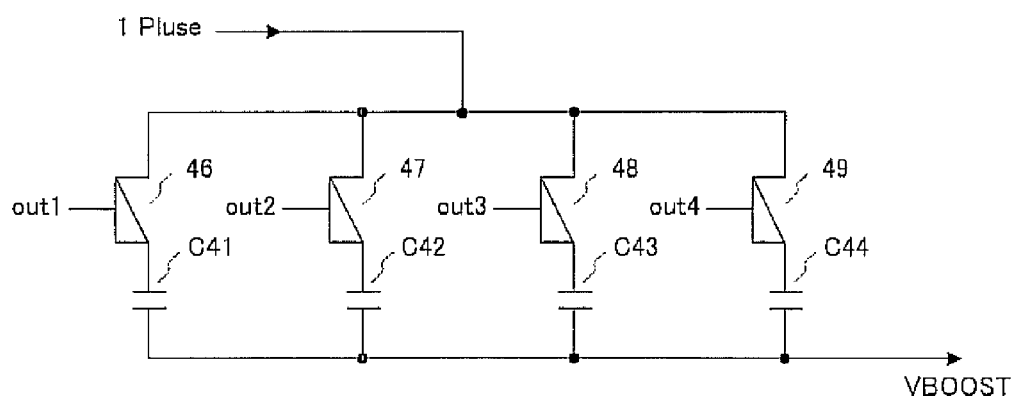

A description will now be given, with reference to FIGS. 9(*a*) and 9(*b*), of a circuit configuration and operation of the booster circuit 40. Referring to FIG. 9(*a*), an FET 45, and resistors R41 through R45 are connected in series between the power supply Vcc and the ground. Nodes N41 to N44 between the adjacent resistors are connected to differential amplifier/comparator circuits 41-44. The differential amplifier circuits are supplied with FVREF. Outputs out1 through out4 of the differential amplifier/comparator circuits 41 to 44 are at the high level when the voltages across the resistors are higher than FVREF, and are at the low level when the voltages across the resistors are lower than FVREF. Referring to FIG. 9(*b*), capacitors C 41 through C44 are connected in parallel, and are connected to select FETs 46 through 49 (P-FETs), respectively. Sets of capacitors C41 to C44 and select FETs 46 to 49 are connected in parallel, and are supplied with a pulse and VBOOST. The pulse is generated by a pulse generating circuit (not shown) in synchronism with the rising edge of the signal BOOST.

The operation of the booster circuit 40 will now be described. Referring to FIG. 9(*a*), voltages obtained by dividing the power supply voltage Vcc by the resistors R41 to R45 occur at the nodes N41 to N44. In a case where the power supply voltage Vcc is a normal voltage, it is assumed that the voltage of the node N43 is lower than FVREF and the voltage of the node N42 is higher than FVREF. In this case, the outputs out3 and out4 are at the low level, and out1 and out2 are at the high level. Thus, the select FETs 48 and 49 shown in FIG. 9(*b*) are turned ON, and select FETs 46 and 47 are turned OFF. Thus, the pulse is boosted through the capacitors C43 and 44 and is output as VBOOST.

In case where the power supply voltage Vcc is lower than the normal voltage, the voltage of the node N42 is lower than FVREF and the voltage of the node N41 is high than FVREF. In this case, the outputs out2, out3 and out4 are at the low level, and out1 is at the high level. Thus, the select FETS 47, 48 and 49 are turned ON and the select FET 46 is turned OFF. The pulse is boosted through the capacitors C42, C43 and C44, and is output as VBOOST. If the power supply voltage Vcc is higher than the normal voltage, the output out4 may be at the low level and outputs out1, out2 and out3 may be at the high level. Thus, the pulse is boosted through the capacitor C44 and is output as VBOOST.

If the power supply voltage Vcc varies, the wave height of the pulse output by the pulse generating circuit also varies. In this case, the booster circuit 40 changes the capacitance of the capacitor and restrains variation in VBOOST. The booster 40 uses the reference voltage FVREF suitable to variations in the power supply voltage Vcc, and generates the voltage suitable to variations in the power supply voltage Vcc. The booster circuit 40 is capable of generating a voltage equal to or higher than the power supply voltage Vcc.

The flash of the second embodiment has the memory cell 61 connected to the output node N11 of the reference voltage generating circuit 10. The semiconductor memory device is required to quickly generate the voltage stable to variations in temperature or power supply voltage at the time of reading or writing data from and into the memory cell. According to the first embodiment, the reference voltage generated by the reference voltage generating circuit 10 is advantageously used for writing data into the memory cell 61 of the semiconductor memory device and reading data therefrom.

The flash memory of the second embodiment has the voltage generating circuit 20 and the booster circuit 40 that use the reference voltage FVREF and generate the voltages applied to the memory cells 61. The voltage generating circuit 20 and the booster circuit 40 use the reference voltage FVREF and generate the given voltages. It is thus possible to apply the voltage stable to the variations in the power supply voltage Vcc to the memory cell 61.

The reference voltage FVREF is used to read data from the memory cell 61. In the semiconductor memory devices like flash memories, data is read from the memory cell 61 on the memory cell basis. This requires the reference voltage quickly generated. The reference voltage FVREF may be advantageously used for reading data from the memory cell 61.

Further, the flash memory of the second embodiment has the switch (FET 13) that is connected to the output node N11 and initiates generation of the reference voltage in response to a change of the address representing the specific memory cell. It is thus possible to start to generate the reference voltage when the address of the memory cell changes and to reduce the time it takes to read data from the memory cell.

In the foregoing, the second embodiment uses the reference voltage generated by the reference voltage generating circuit 10 when data is read from the memory cell 61. This reference voltage may be used for programming and erasing of the memory cell 61 in addition to reading. The reference voltage may also be used as a reference voltage for writing and reading in semiconductor memory devices other than the flash memories.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 10:
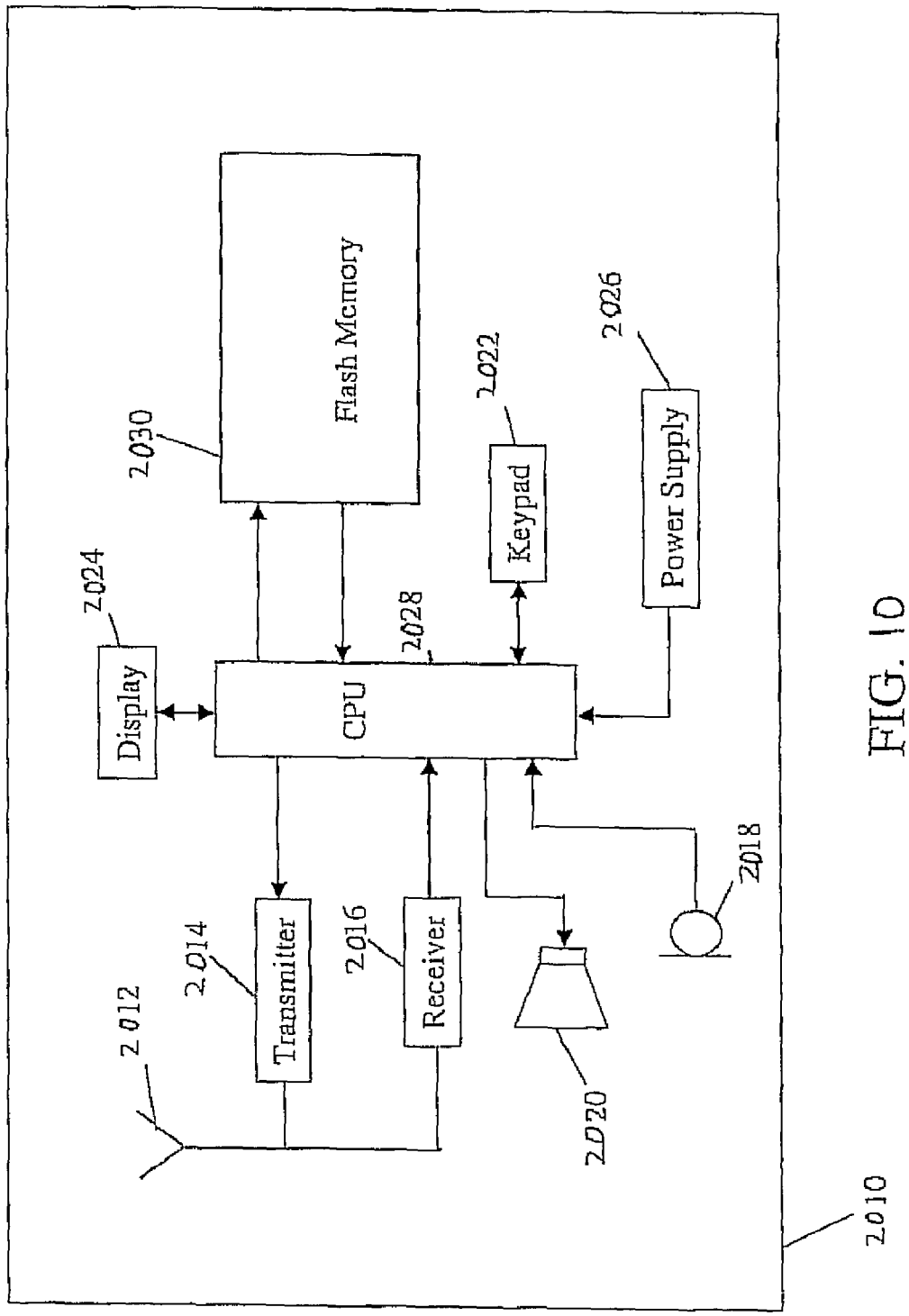
FIG. 10 illustrates a block diagram of a conventional portable phone, upon which embodiments can be implemented.

FIG. 10 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: first and second resistor parts connected in series between a first power supply and a second power supply; an output node provided between the first and second resistor parts, a reference voltage being output via the output node; a feedback node provided between the first power supply and the first resistor part; and a voltage control circuit that maintains a voltage of the feedback node at a constant level by using the reference voltage of the output node and the voltage of the feedback node.

Embodiments can generate a reference voltage that does not greatly depend on the power supply voltage. As a result, among other things, embodiments facilitate the production of flash memory that can generate a reference voltage that does not greatly depend on the power supply voltage This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, Internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 11:
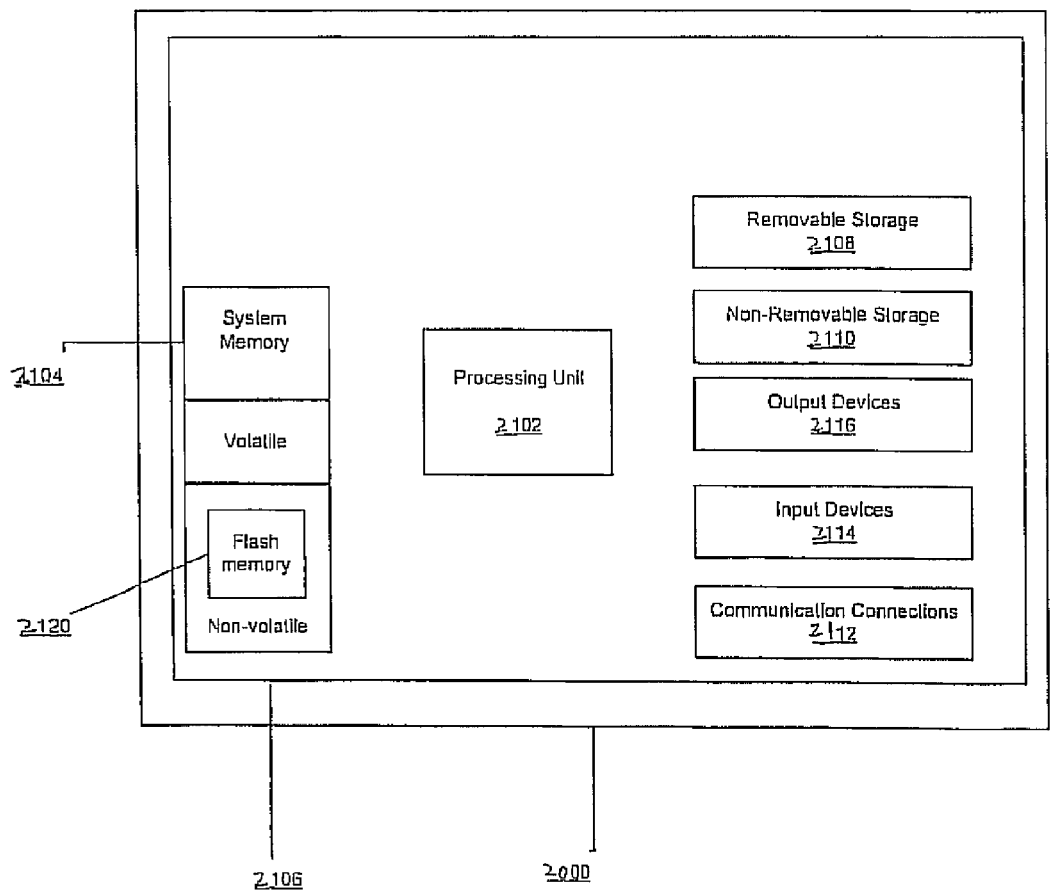
FIG. 11 illustrates a block diagram of a computing device, upon which embodiments of the present claimed subject matter can be implemented.

FIG. 11 illustrates a block diagram of a computing device 2100, upon which embodiments of the present claimed subject matter can be implemented. Although computing device 2100 is shown and described in FIG. 11 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 11.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 11 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: first and second resistor parts connected in series between a first power supply and a second power supply; an output node provided between the first and second resistor parts, a reference voltage being output via the output node; a feedback node provided between the first power supply and the first resistor part; and a voltage control circuit that maintains a voltage of the feedback node at a constant level by using the reference voltage of the output node and the voltage of the feedback node.

Embodiments can generate a reference voltage that does not greatly depend on the power supply voltage. As a result, among other things, embodiments facilitate the production of flash memory that can generate a reference voltage that does not greatly depend on the power supply voltage This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, Internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 12:
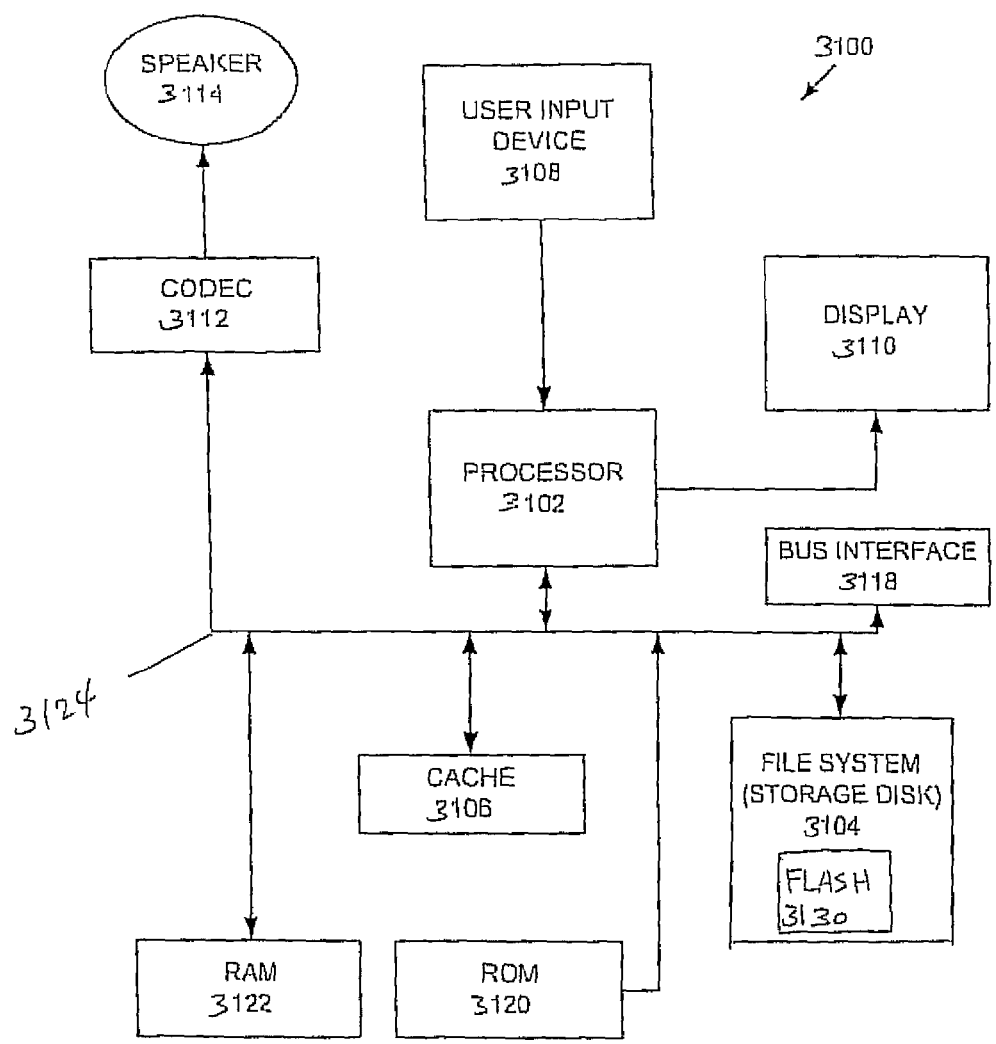
FIG. 12 illustrates an exemplary portable multimedia device, or media player, in accordance with an embodiment of the present claimed subject matter.

FIG. 12 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: first and second resistor parts connected in series between a first power supply and a second power supply; an output node provided between the first and second resistor parts, a reference voltage being output via the output node; a feedback node provided between the first power supply and the first resistor part; and a voltage control circuit that maintains a voltage of the feedback node at a constant level by using the reference voltage of the output node and the voltage of the feedback node.

Embodiments can generate a reference voltage that does not greatly depend on the power supply voltage. As a result, among other things, embodiments facilitate the production of flash memory that can generate a reference voltage that does not greatly depend on the power supply voltage This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Figure 13:
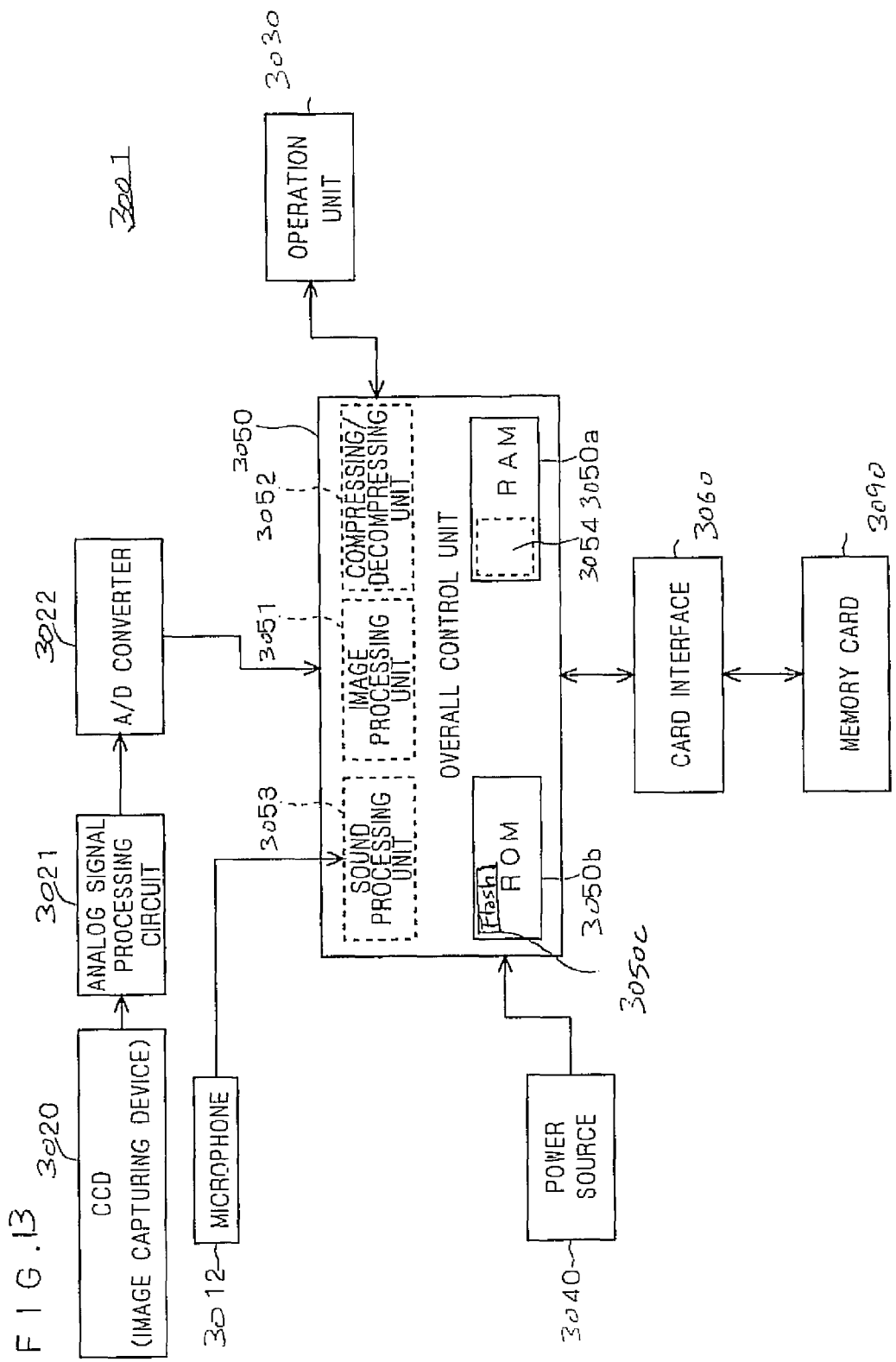
FIG. 13 illustrates an exemplary digital camera, in accordance with an embodiment of the present claimed subject matter.

Referring to FIG. 13, the internal configuration of a digital camera 3001 is described. FIG. 13 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050a is a semiconductor memory (such as DRAM) which can be accessed at high speed and the ROM 3050b takes the form of, for example, an electrically-rewritable nonvolatile semiconductor memory (such as flash ROM 3050c). A flash memory, in one embodiment, includes: first and second resistor parts connected in series between a first power supply and a second power supply; an output node provided between the first and second resistor parts, a reference voltage being output via the output node; a feedback node provided between the first power supply and the first resistor part; and a voltage control circuit that maintains a voltage of the feedback node at a constant level by using the reference voltage of the output node and the voltage of the feedback node.

Embodiments can generate a reference voltage that does not greatly depend on the power supply voltage. As a result, among other things, embodiments facilitate the production of flash memory that can generate a reference voltage that does not greatly depend on the power supply voltage This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050*a* or ROM 3050*b* of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

The present invention is not limited to the specifically disclosed embodiments, but include variations variation and modifications without departing from the scope of the claimed invention.

What is claimed is:

1. A computing device comprising:
    a processor;
    an input component;
    an output component;
    a memory comprising:
    a volatile memory; and
    a flash memory comprising:
        first and second resistor parts connected in series between a first power supply and a second power supply;
        an output node provided between the first and second resistor parts, a reference voltage being output via the output node wherein the feedback node comprises a node that couples first and second transistors;
        a feedback node provided between the first power supply and the first resistor part; and
        a voltage control circuit that maintains a voltage of the feedback node at a constant level by using the reference voltage of the output node and the voltage of the feedback node.

2. The computing device of claim 1, wherein said computing device is a personal computer (PC).

3. The computing device of claim 1, wherein said computing device is a personal digital assistant (PDA).

4. The computing device of claim 1, wherein said computing device is a gaming system.

* * * * *